(12) United States Patent
Han et al.

(10) Patent No.: US 8,977,917 B2
(45) Date of Patent: Mar. 10, 2015

(54) HIGHLY SECURE AND EXTENSIVE SCAN TESTING OF INTEGRATED CIRCUITS

(71) Applicant: Lattice Semiconductor Corporation, Hillsboro, OR (US)

(72) Inventors: Wei Han, Beaverton, OR (US); Zheng Chen, Allentown, PA (US); Eric Lee, Allentown, PA (US); Jie Qin, San Jose, CA (US); Shankar Durgamahanthi, San Jose, CA (US); Kanad Chakraborty, Portland, OR (US); Dan Ratchen, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 109 days.

(21) Appl. No.: 13/858,422

(22) Filed: Apr. 8, 2013

(65) Prior Publication Data

US 2014/0136914 A1 May 15, 2014

Related U.S. Application Data

(60) Provisional application No. 61/714,636, filed on Oct. 16, 2012.

(51) Int. Cl.
| | |
|---|---|
| G01R 31/28 | (2006.01) |
| H03M 1/34 | (2006.01) |
| G11C 11/413 | (2006.01) |
| H04L 25/02 | (2006.01) |
| H04L 12/24 | (2006.01) |
| G01R 31/3185 | (2006.01) |
| H03M 1/00 | (2006.01) |
| H01L 23/498 | (2006.01) |
| H01L 23/50 | (2006.01) |

(52) U.S. Cl.
CPC ............... *H03M 1/34* (2013.01); *G11C 11/413* (2013.01); *H04L 25/0262* (2013.01); *H04L 41/0806* (2013.01); *H01L 23/49816* (2013.01); *H01L 23/49822* (2013.01); *H01L 23/49838* (2013.01); *H01L 23/50* (2013.01); *G01R 31/318597* (2013.01); *H03M 1/001* (2013.01); *H01L 2224/16225* (2013.01); *H01L 2224/32225* (2013.01); *H01L 2224/73204* (2013.01); *H01L 2924/15311* (2013.01); *H01L 2924/13091* (2013.01)
USPC ............................ 714/727; 714/724; 714/736

(58) Field of Classification Search
CPC ................. G01R 31/318555; G01R 31/318572
USPC .................. 714/727, 724, 733, 736, 726, 25; 710/302
See application file for complete search history.

(56) References Cited

U.S. PATENT DOCUMENTS 5,819,053 A * 10/1998 Goodrum et al. ............. 710/100
6,052,513 A *  4/2000 MacLaren ..................... 710/114

(Continued)

OTHER PUBLICATIONS

Lee Whetsel, "An IEEE 1149.1 Based Logic/Signature Analyzer in a Chip," IEEE International Test Conference, Oct. 26-30, 1991, Paper 32.2, pp. 869-878.

*Primary Examiner* — Fritz Alphonse

(57) ABSTRACT

In one embodiment, an integrated circuit chip has an input/output (I/O) interface and programmable fabric. The I/O interface restricts access to scan testing of the chip by requiring (1) a specific scan-testing instruction, (2) a specific manufacturing key, and (3) a specific fabric pattern value from a specific set of registers in the programmed fabric. In addition or alternatively, the I/O interface has circuitry that enables scan testing of most of the logic of the I/O interface itself, including the logic being driven by the JTAG TAP state register.

20 Claims, 5 Drawing Sheets

(56) References Cited

U.S. PATENT DOCUMENTS

| | | | |
|---|---|---|---|
| 6,055,590 A * | 4/2000 | Pettey et al. ................... 710/56 |
| 6,055,596 A * | 4/2000 | Cepulis ........................ 710/104 |
| 6,101,322 A * | 8/2000 | Goodrum et al. ............. 710/302 |
| 7,080,300 B1 | 7/2006 | Herron et al. |
| 7,398,441 B1 | 7/2008 | Gee |
| 7,502,979 B2 | 3/2009 | Dastidar |
| 7,607,057 B2 | 10/2009 | Boike et al. |
| 7,620,864 B2 | 11/2009 | Elliott |
| 7,725,784 B2 | 5/2010 | Laouamri et al. |
| 7,917,820 B1 | 3/2011 | Pavle et al. |

* cited by examiner

100

404

HIGHLY SECURE AND EXTENSIVE SCAN TESTING OF INTEGRATED CIRCUITS

CROSS-REFERENCE TO RELATED APPLICATIONS

This application claims the benefit of the filing date of U.S. provisional application No. 61/714,636, filed on Oct. 16, 2012, the teachings of which are incorporated herein by reference in their entirety.

TECHNICAL FIELD

The present invention relates to integrated circuits, such as field-programmable gate arrays (FPGAs), and, more specifically but not exclusively, to scan testing of such devices.

BACKGROUND

This section introduces aspects that may help facilitate a better understanding of the invention. Accordingly, the statements of this section are to be read in this light and are not to be understood as admissions about what is prior art or what is not prior art.

Scan testing is used by integrated circuit (IC) manufacturers to determine structurally whether or not there are any manufacturing defects in the integrated circuit. During scan testing, external automated test equipment (ATE) configures a chip into a scan-test mode that provides access to monitor the internal processing of the chip's core logic, e.g., by making intermediate processing results available outside of the chip's logic. Depending on the particular implementation, the input data applied to the chip's core logic during scan testing may be provided by the ATE or by special on-chip BIST (built-in self testing) circuitry. Similarly, depending on the particular implementation, the intermediate processing results from the chip's core logic may be transmitted to the ATE for evaluation or may be evaluated by the on-chip BIST circuitry to determine whether or not the chip's core logic has a manufacturing defect.

In many situations, it is desirable to restrict access to a chip's scan-test mode. For example, a chip manufacturer may want to prevent its customers from performing scan testing on its chips in order to preserve confidential information regarding the internal processing by those chips. It is also desirable to provide scan testing that is capable of testing as much of a chip's core logic as possible.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
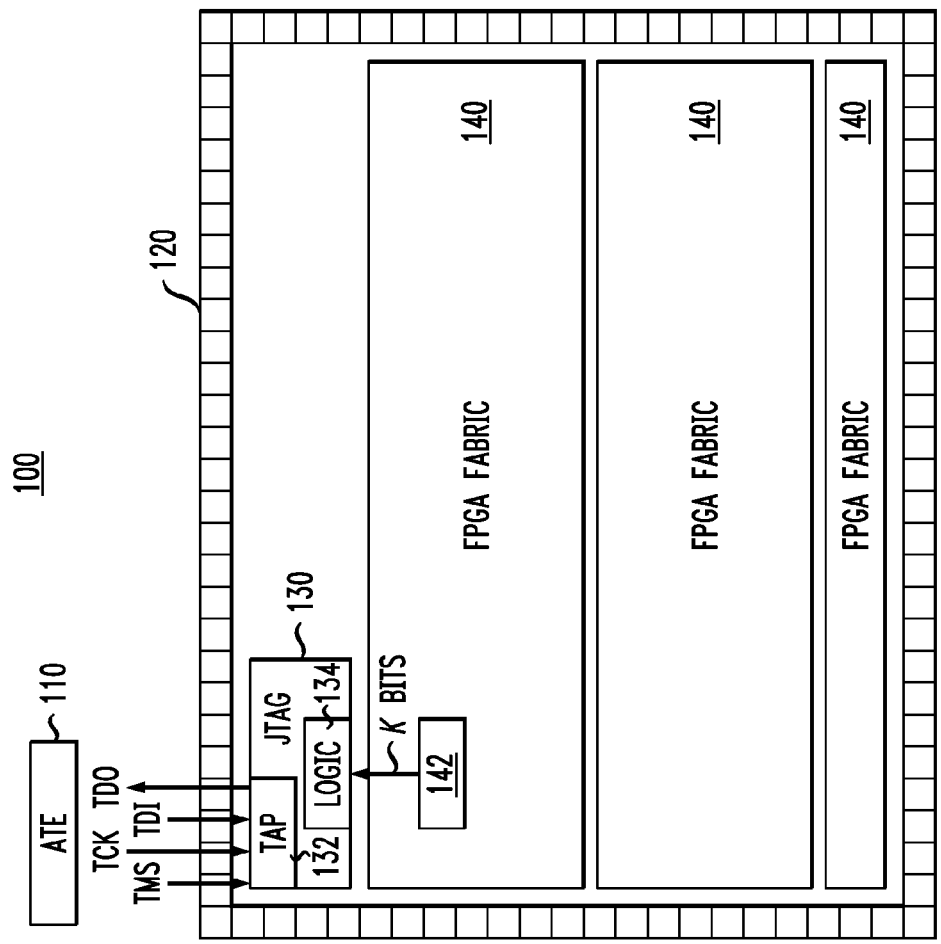
FIG. 1 shows a high-level block diagram of a test configuration for performing scan testing of a field-programmable gate array (FPGA) chip.

FIG. 1 shows a high-level block diagram of a test configuration 100 for performing scan testing of a field-programmable gate array (FPGA) chip 120. In particular, scan testing determines whether there are manufacturing defects in non-programmable (i.e., ASIC-like) core logic within chip 120. In this particular configuration, external automated test equipment (ATE) 110 communicates with chip 120 via the chip's JTAG (joint test action group) interface 130, which conforms to the IEEE 1149.1 Standard Test Access Port and Boundary-Scan Architecture standard, the teachings of which are incorporated herein by reference in their entirety. As indicated in FIG. 1, TAP (Test Access Port) controller 132 of JTAG interface 130 has (at least) the following four pins:

TDI (Test Data In)—used to transmit incoming data from ATE 110 to the chip;

TDO (Test Data Out)—used to transmit outgoing data from the chip to ATE 110;

TCK (Test Clock)—used to transmit a test clock signal from ATE 110 to the chip; and TMS (Test Mode Select)—used to transmit a test mode control signal from ATE 110 to the chip.

In addition to TAP controller 132, JTAG interface 130 also has JTAG logic 134, which controls the operations of JTAG interface 130. At a high level, to perform scan testing of chip 120, ATE 110 transmits appropriate signals to the chip via JTAG TAP controller 132 that cause JTAG logic 134 to place chip 120 into its scan-test mode. Once the chip is configured into its scan-test mode, JTAG TAP controller 132 is parked into a run-test-idle (RTI) mode, and scan testing is performed using other (i.e., non-JTAG) I/O circuitry of chip 120 by implementing one or more scan-testing cycles, each cycle comprising the following three phases:

Scan Load (or Shift In): In this phase, a sequence of scan-testing input data is transmitted from ATE 110 to chip 120 by shifting the input data serially through the scan-in ports of the scan chains. During this phase, a scan enable signal (aka a shift enable signal) is held active by the ATE.

Scan Capture: After completion of a scan load, the scan enable signal is turned off by the ATE. As a result, scan registers within the scan chains are configured to do a parallel capture (as opposed to a serial shift). During this phase, the circuit response to the test data that was shifted during the immediately preceding scan load will be captured through the data (D) inputs of the scan register. This may require one or more capture clock cycles.

Scan Unload (or Shift Out): In this phase, the circuit response during the Scan Capture phase (i.e., data representing the processing performed by the chip's core logic) is transmitted from the chip to the ATE by shifting serially through the scan chains. During this phase, the scan enable signal is again held active by the ATE.

Note that the Scan Unload phase for one scan-testing cycle can be implemented at the same time (i.e., simultaneously, concurrently) as the Scan Load phase for the next scan-testing cycle, such that the ATE reads from the chip outgoing data via the chip's scan output ports from the one cycle at the same time that the ATE writes into the chip incoming data via the chip's scan input ports for the next cycle. As explained further below with respect to FIG. 2, JTAG interface 130 is designed to restrict access to scan testing of chip 120. In addition, as explained further below with respect to FIGS. 4 and 6, JTAG interface 130 is designed to perform scan testing on some of its own JTAG logic 134 in addition to performing scan testing on the core logic in chip 120.

Figure 2:
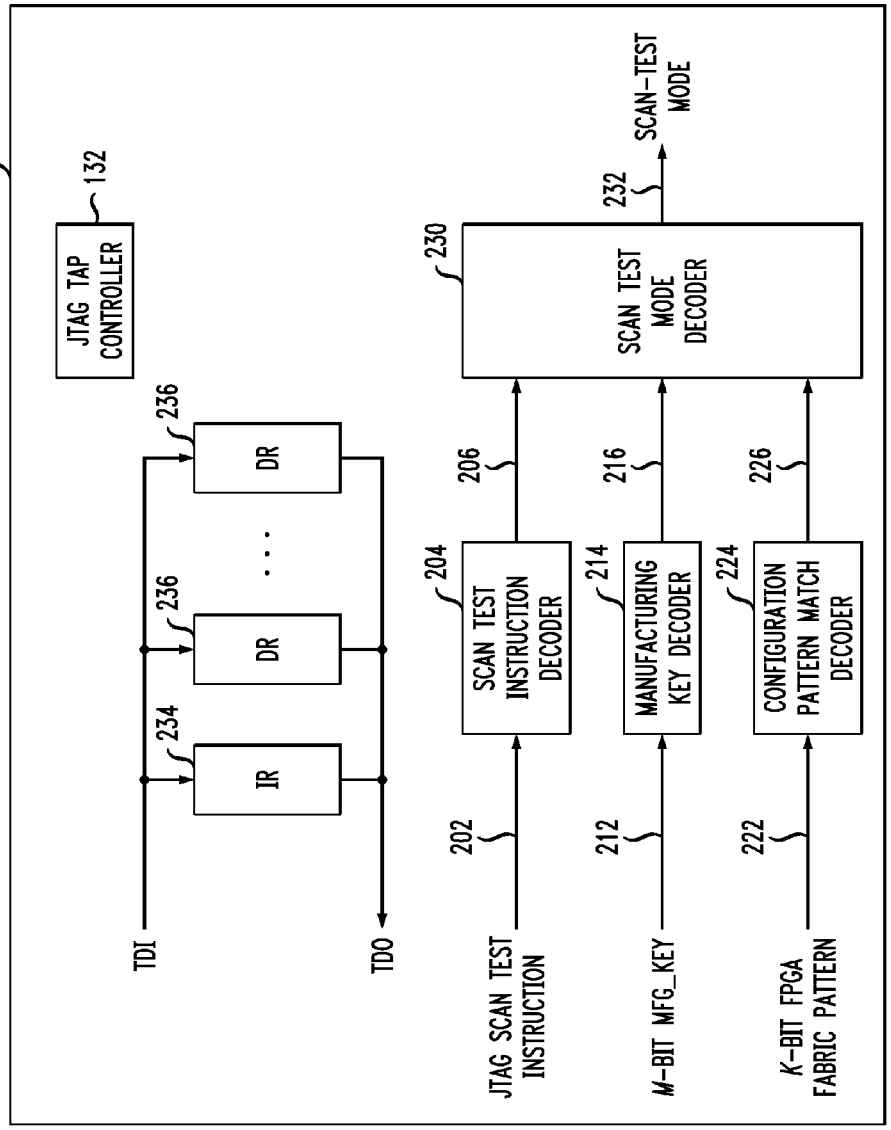
FIG. 2 shows a simplified functional block diagram of a portion of the JTAG interface of FIG. 1 that is associated with determining whether or not to allow scan testing of the chip to proceed.

FIG. 2 shows a simplified functional block diagram of a portion of JTAG interface 130 of FIG. 1 that is associated with determining whether or not to allow scan testing of chip 120 to proceed. As shown in FIG. 2, JTAG interface 130 receives three different inputs 202, 212, and 222, and, based on those inputs, determines whether to configure chip 120 into its scan-test mode, as reflected by the scan-test mode signal 232. In particular, JTAG interface 130 applies three different processing algorithms to the three different inputs. These three different processing algorithms may be said to be different, independent parts of a three-part process for configuring chip 120 into its scan-test mode. If each of the three processing algorithms produces a positive result, then the three-part scan-test configuration process passes, and JTAG interface 130 determines that chip 120 should be configured into its scan-test mode, thereby asserting scan-test mode signal 232. If any one or more of the three processing algorithms produces a negative result, then the three-part scan-test configuration process fails, and JTAG interface 130 determines that chip 120 should not be configured into its scan-test mode, thereby de-asserting scan-test mode signal 232.

One part of the three-part scan-test configuration process involves ATE 110 transmitting, via the TDI pin of JTAG TAP controller 132, a confidential JTAG scan-test instruction 202 that is stored in JTAG instruction register (IR) 234. This scan-test instruction is decoded by instruction decoder 204, which determines whether the provided instruction is the confidential instruction for scan testing. The resulting one-bit decoded instruction 206 is provided to scan-test mode decoder 230.

Another part of the three-part scan-test configuration process involves ATE 110 transmitting, via the TDI pin of JTAG TAP controller 132, a confidential manufacturing key value 212 that is decoded by manufacturing key decoder 214, which determines whether the provided value is the confidential manufacturing key for scan testing. The resulting one-bit decoded manufacturing key 216 is provided to scan-test mode decoder 230.

The third part of the three-part scan-test configuration process involves ATE 110 transmitting, via the TDI pin of JTAG TAP controller 132, a set of configuration data for programming some or all of the FPGA's programmable fabric 140. Among the many programmable cells in fabric 140 are a particular set of K (contiguous or non-contiguous) SRAM cells (labeled 142 in FIG. 1) that are configured to provide their programmed values as a K-bit fabric pattern 222 to FPGA SRAM configuration pattern match detector 224, which decodes the K-bit fabric pattern value to determine whether the fabric pattern has the correct value for scan testing. In particular, pattern match detector 224 is hard coded based on a confidential K-bit value. Pattern match detector 224 performs a bit-by-bit comparison between its confidential, hard-coded K-bit value and the K-bit fabric pattern 220 received from the K SRAM cells 142. If all of the different pairs of corresponding bits match, then pattern match detector 224 indicates that the programmed fabric pattern is the same as the confidential, hard-coded value. In addition to the correct fabric pattern value being confidential, the identity of the K fabric cells that store the confidential fabric pattern value is also confidential. The resulting one-bit decoded fabric pattern 226 is provided to scan-test mode decoder 230.

The remaining part of the configuration data includes the programming pattern needed to program and route chip-level input/output pads to internal scan-in and scan-out ports of chip 120. These pads are driven by the ATE 110 during test.

If all three parts of the three-part scan-test configuration process produce positive results (e.g., all three one-bit values 206, 216, and 226 equal to 1), then scan-test mode decoder 230 asserts (e.g., sets to logic 1) scan-test mode signal 232 to indicate that scan testing of chip 120 is to be performed. Otherwise, scan-test mode signal 232 is de-asserted (e.g., set to logic 0) to indicate that scan testing of chip 120 is not to be performed. In this way, the three-part scan-test configuration process provides reliability and high security by limiting access to scan testing of chip 120 only to those who have the wherewithal to pass all three parts of the three-part scan-test configuration process. Note that, in some implementations, any one or two of the parts of the three-part scan-test configuration process may be omitted.

Decoders 204, 214, 224, and 230 may be considered to be part of JTAG logic 134 of FIG. 1, which also includes other logic not shown in FIG. 2.

Figure 3:
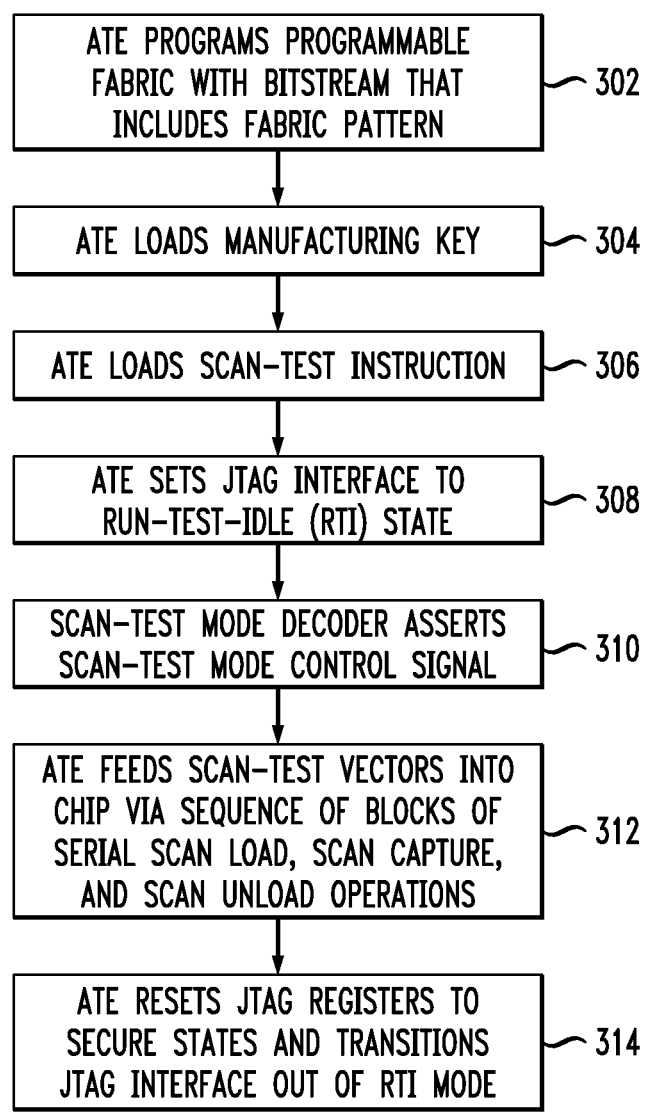
FIG. 3 shows a flow diagram of the processing associated with scan testing using the configuration of FIG. 2.

FIG. 3 shows a flow diagram of one possible sequence of processing associated with scan testing using the configuration of FIG. 2.

In step 302, after power-on-reset, in compliance with the IEEE 1149.1 Standard TAP state diagram, and via JTAG TAP controller 132, ATE 110 programs programmable fabric 140 of chip 120 with data that includes the confidential K-bit fabric pattern value 222 that is decoded by pattern match decoder 224. Step 302 is implemented by (i) the ATE loading a non-confidential "program fabric" JTAG instruction into instruction register 234 and then (ii) the ATE shifting the soft IP (bitstream) for the scan test via a corresponding JTAG data register 236 into RAM bits within the programmable fabric 140 within chip 120. Note that JTAG interface 130 has a single instruction register 234 and multiple data registers 236, each of which corresponds to a particular instruction implemented by JTAG interface 130 when that instruction value is stored in IR 234. As a result, the K confidential internal RAM bits in cells 142 are set to the K-bit fabric pattern value 222. If fabric 140 is appropriately programmed, then this K-bit value represents a secret code or key to enter into scan-test mode for chip 120. In that case, pattern match decoder 224 will receive the K-bit value 222 from programmed fabric 140 and decode that value to assert the one-bit decoded fabric pattern signal 226.

In step 304, ATE 110 loads, via JTAG TAP controller 132, the confidential M-bit manufacturing key value 212 to be decoded by manufacturing key decoder 214. Step 304 is implemented by (i) the ATE loading a confidential "manufacturing key" JTAG instruction into instruction register 234 and then (ii) the ATE loading the confidential manufacturing key value 212 via a corresponding JTAG data register 236 into manufacturing key decoder 214, which decodes the confidential manufacturing key value to assert the one-bit decoded manufacturing key signal 216.

In step 306, ATE 110 loads, via JTAG TAP controller 132 and JTAG instruction register 234, the confidential JTAG scan-test instruction 202 into scan test instruction decoder 204, which decodes the scan-test instruction to assert decoded scan-test instruction signal 206.

In step 308, ATE 110 sets and holds JTAG interface 130 at the run-test-idle (RTI) state by driving and keeping the JTAG TMS pin low.

In step 310, upon the second clock cycle of test clock TCK after moving into the RTI state, assuming that all three parts of the three-part scan-test configuration process are satisfied, scan-test mode decoder 230 asserts the internal scan-test mode signal 232. The second clock cycle after moving into the RTI state is defined as the execution point for all IEEE 1532 standard instructions.

In step 312, ATE 110 feeds scan-test vectors to chip 120 via a sequence of blocks of serial scan load, scan capture, and scan unload operations as described previously with respect to FIG. 1.

After all the blocks of scan loads/unloads have been applied, in step 314, ATE 110 resets all internal registers to secure states and transitions JTAG interface 130 out of the RTI state by asserting the TMS signal via the TMS pin. In one possible implementation, some of the non-JTAG internal registers are reset before transitioning out of the RTI state, and others are reset after the transition from the RTI state to the reset (i.e., Test-Logic-Reset) state at the completion of scan testing.

Figure 4:
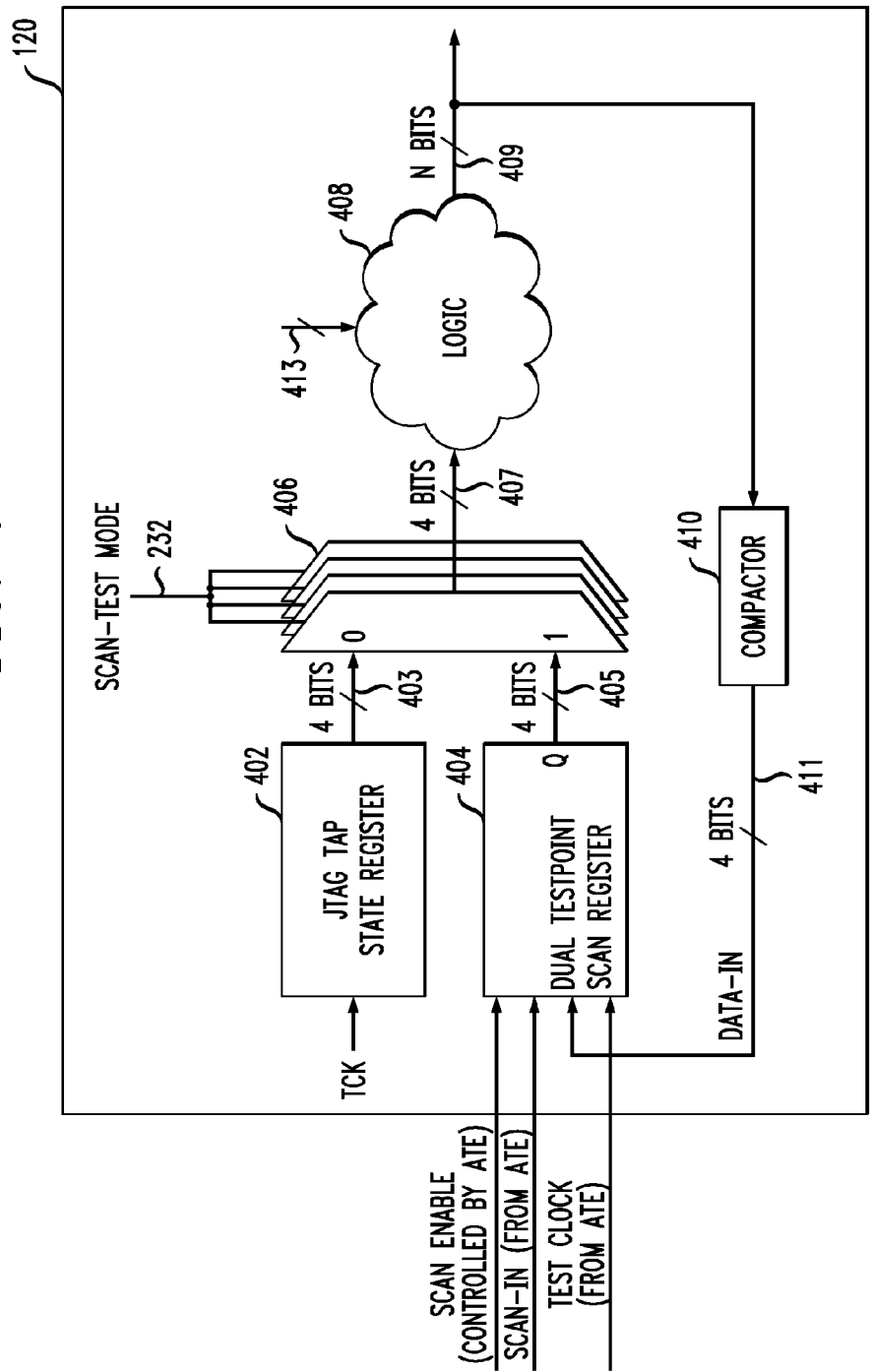
FIG. 4 shows a simplified functional block diagram of a portion of the chip of FIG. 1 that is associated with the scan testing of core logic that includes non-programmable logic of the JTAG interface.

FIG. 4 shows a simplified functional block diagram of a portion of chip 120 of FIG. 1 that is associated with the scan testing of logic 408. Logic 408 typically includes both non-programmable logic of the JTAG interface itself as well as other core logic of chip 120 that is not part of the JTAG interface. Note that the non-programmable logic of JTAG interface 130 that is part of logic 408 is in JTAG logic 134 of FIG. 1, but does not include decoders 204, 214, 224, and 230 of FIG. 2, which are not subject to scan testing.

As shown in FIG. 4, chip 120 has (i) JTAG TAP state register 402, which is part of JTAG interface 130, and (ii) dual testpoint scan register 404, which is not part of JTAG interface 130. State register 402 controls the normal operations of logic 408 when scan testing is not being performed. When scan testing is being performed, then scan register 404 controls the scan-testing operations of logic 408. In particular, JTAG TAP state register 402 stores a 4-bit control signal 403 that identifies the operating mode for the portion of JTAG logic 134 under test, when scan testing of chip 120 is not being performed. Similarly, dual testpoint scan register 404 stores a 4-bit data signal 405 that can be used to store a control signal that identifies the operating mode for the portion of JTAG logic 134 under test, when scan testing of chip 120 is being performed. Note that other control signals 413 may also be applied to logic 408 from other internal registers and/or by primary input pads driven directly by ATE 110 for scan testing of those portions of logic 408 that are not part of JTAG interface 130.

Multiplexers (muxes) 406 selectively apply either control signal 403 or control signal 405 to logic 408 as logic control signal 407 depending on the value of scan-test mode signal 232. In this implementation, if scan-test mode signal 232 is logic zero, indicating that scan testing is disabled, then muxes 406 select control signal 403 as logic control signal 407. Otherwise, if scan-test mode signal 232 is logic one, indicating that scan testing is enabled, then muxes 406 select control signal 405 as logic control signal 407.

As indicated in FIG. 4, the N-bit data 409 generated by logic 408 is provided to other logic or circuitry within chip 120. In addition, N-bit data 409 is fed back to compactor 410, which compresses N-bit data 409 to generate 4-bit compressed data 411, which is stored into dual testpoint scan register 404. Note that, if N is less than or equal to 4, then compactor 410 is not needed and may be omitted.

In one implementation, register 402, muxes 406, and compactor 410 may be said to be part of JTAG interface 130 of FIG. 1. In addition to controlling the non-scan-test operations of logic 408, JTAG TAP state register 402 is used to perform the operations required to move the chip into scan-test mode. In particular, these operations correspond to the three-part scan-test configuration process described previously with respect to FIG. 2. Once scan-test mode (signal 232) gets asserted, dual testpoint scan register 404 controls the portion of JTAG logic 134 under test through the set of test muxes 406. The rest of logic 408 is driven by other internal scan (or non-scan) registers and/or by primary input pads driven directly by the ATE. The N-bit data 409 represents N output ports of logic 408, not merely the outputs of the JTAG portion of the logic under test. In the prior art, these N outputs are not always observable via scan testing. For example, if these N outputs go to other circuits within the chip that do not support scan testing, or are used to control analog and mixed-signal blocks, then these N output ports would not be observable via scan testing.

Figure 5:
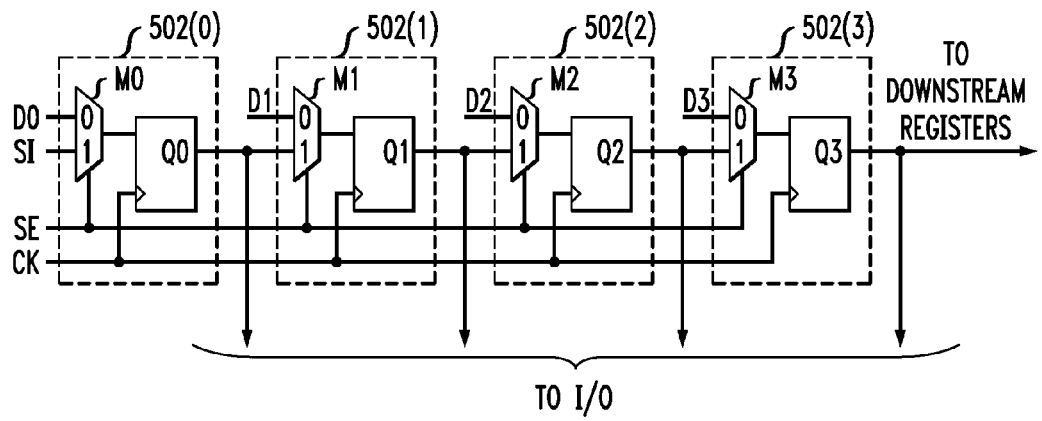
FIG. 5 shows a schematic block diagram representing four 1-bit registers used to form the dual testpoint scan register of FIG. 4.

FIG. 5 shows a schematic block diagram representing the four 1-bit registers 502(0)-502(3) used to form dual testpoint scan register 404 of FIG. 4. As indicated in FIG. 5, registers 502(0)-502(3) may be four consecutive registers in a much longer scan chain consisting of one or more upstream 1-bit registers and/or one or more downstream 1-bit registers. Each register 502($i$) includes a latch (e.g., flip-flop) Qi and a (2×1) mux Mi whose data output port is connected to the data input port of latch Qi.

For register 502(0), mux M0 receives, at its two data input ports, data bit D0 and one bit of scan-in data SI. Data bits D0-D3 are the four bits of compressed data 411 of FIG. 4, while scan-in data SI is the scan-in data of FIG. 4. For each other register 502($i$), i=1-3, mux Mi receives, at its two data input ports, data bit Di and the data bit output by the previous latch Q(i−1). In addition to being provided to the next latch (i+1), the data bit output by each latch Qi is provided to a chip I/O pin. For all four registers 502($i$), the scan enable control signal SE is applied to the control port of mux Mi, and the scan test clock CK is applied to the clock input port of latch Qi. The scan enable control signal SE and the scan test clock CK are the scan enable and test clock signals, respectively, of FIG. 4.

Figure 6:
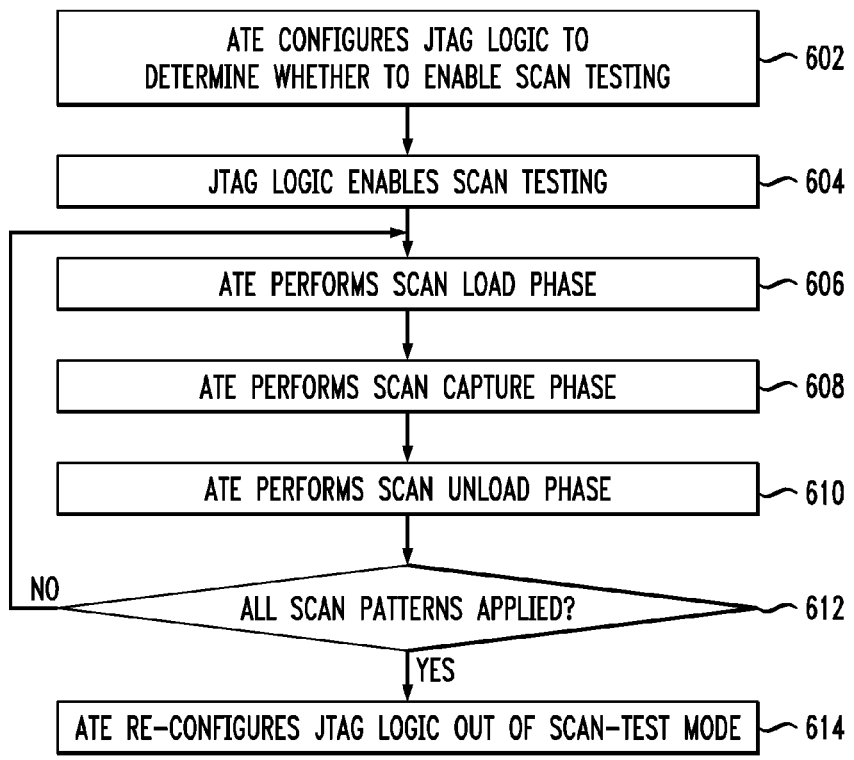
FIG. 6 shows a flow diagram of the processing associated with scan testing using the configurations of FIGS. 4 and 5.

FIG. 6 shows a flow diagram of one possible sequence of processing associated with scan testing using the configurations of FIGS. 4 and 5. Prior to scan testing of chip 120 being initiated, the value of scan-test mode signal 232 is zero, muxes 406 select 4-bit control signal 403 stored in JTAG TAP state register 402, and the JTAG portion of logic 408 is configured based on control signal 403.

In step 602, ATE 110 sets the 4-bit control signal 403 to configure the JTAG logic 134 to be able to perform the processing described in the context of FIG. 2 that determines whether or not to enable scan testing of chip 120. If and when the JTAG logic determines that scan testing is allowed to proceed in step 604, then scan-test mode decoder 230 of FIG. 2 will assert scan-test mode signal 232, muxes 406 will select 4-bit control signal 405 stored in dual testpoint scan register 404, and the JTAG portion of logic 408 will be configured based on control signal 405. In particular, ATE 110 can set and modify the value of control signal 405 during scan testing to operate the JTAG portion of logic 408 in one or more of its different operating modes.

In step 606, ATE 110 performs the Scan Load phase of scan testing. During the Scan Load phase, the ATE loads new test data into all of the scan chains of the logic under test, including 4-bit dual-testpoint scan register 404, using serial scan-shift operations. During this phase, the ATE sets the scan enable signal SE to 1, and the shift-in data is sourced from port SI of each scan flip-flop 502($i$) of FIG. 5. The SI input port of each scan flip-flop is either directly driven by the ATE or is tied to the Q output of the previous scan flip-flop in the scan chain. Therefore, when SE is 1, there is a chain of scan flip-flops, where the Q output of each flip-flop is connected to the SI input of the next flip-flop.

After loading all the scan chains, in step 608, ATE 110 performs the Scan Capture phase of scan testing by de-asserting the scan enable signal SE. During the Scan Capture phase, the scan-test data that was loaded during the Scan Load phase is processed by logic 408. Then the ATE pulses the scan clock CK to capture the circuit responses. During this operation, all internal logic outputs get loaded into internal scan registers, with the 4-bit output 411 of compactor 410 getting loaded into the 4-bit D-input of dual testpoint scan register 404. There is no harm in doing this since the test data that was previously loaded into register 404 during the Scan Load phase has already been processed by the logic under test.

After the Scan Capture is complete, in step 610, ATE 110 performs the Scan Unload phase of scan testing by again asserting the scan enable signal SE. During the Scan Unload phase, the data captured in all the scan flip-flops during the Scan Capture phase (including the data captured in register 404) is shifted out serially to the ATE from the scan-out port(s) of the scan chain(s) and compared with the expected data. In step 612, ATE 110 determines whether there is another scan pattern to be applied. If so, then processing returns to step 606 for the next scan-test cycle. Thus, steps 606-610 are repeated for each different cycle of the scan testing. In one possible implementation, except for the last cycle of scan testing, the Scan Unload phase of step 610 is performed for the current scan-test cycle at the same time that the Scan Load phase of step 606 is performed for the next scan-test cycle.

In one embodiment, scan testing is implemented in conformance with the IEEE 1149.1 standard. According to this standard, when scan testing is under way, the JTAG TAP controller is 'parked' at RTI (run-test-idle) state, and the scan test mode signal is asserted as described with respect to FIG. 2. With the chip configured in scan test mode, during scan testing, the ATE directly (i) drives scan test data, (ii) controls the scan enable signal, scan clock(s), and any scan set/reset ports, and (iii) observes scan output responses. In particular, in one possible implementation, the ATE drives the scan enable signal and scan test data through scan enable and scan input ports, and samples the output responses coming out from the scan output port(s) directly after the chip has been configured into scan test mode, where the scan enable, input, and output ports are not part of the JTAG interface. Note that the JTAG TCK port can, but does not have to be used, as the scan clock port. In some alternative implementations, JTAG input/output ports can be reused as scan test ports.

After ATE 110 determines in step 612 that there are no more scan patterns to be applied and that therefore the end of scan testing has been reached, in step 614, ATE 110 reconfigures the JTAG logic out of scan-testing mode, in an IEEE Std 1149.1-compliant manner, e.g., by forcing a hardware reset on internal registers and then having the ATE assert the JTAG TMS to exit the TAP controller out of run-test-idle (RTI) state such that the JTAG logic will once again be controlled by control signal 403 stored in JTAG TAP state register 402.

Thus, during the Scan Load and Scan Unload phases of scan testing, the scan enable control signal SE is set to logic 1. During the Scan Capture phase of scan testing, the scan enable control signal SE is set to logic 0. Thus, during the Scan Load and Scan Unload phases, at every clock cycle, the next bit of scan-in data SI is stored into register 502(0), and the previous three bits of scan-in data are respectively shifted downstream to the next register 502(i), i=1-3. During the Scan Capture phase, at every clock cycle, the four compressed data bits D0-D4 are re-written into the four registers 502(0)-502(3). During the Scan Unload phase, the contents of these registers are shifted out to ATE 110 of FIG. 1 via one or more scan-output pins. Note that, in general, JTAG pin TDO could be, but does not have to be, one of the scan-output pins being observed by the ATE.

Note that step 602 of FIG. 6 corresponds to steps 302-306 of FIG. 3, step 604 corresponds to steps 308-310, steps 606-612 corresponds to step 312, and step 614 corresponds to step 314.

The configuration of FIGS. 4 and 5 and the procedure of FIG. 6 enable scan testing to be performed on almost all of the non-programmable logic associated with JTAG interface 130, thereby providing extensive scan testing of chip 120. Adding dual testpoint scan register 404 improves scan-test coverage in at least two ways:
 1. It increases controllability of the downstream logic being driven by the JTAG state machine. This is due to the fact that the ATE can drive test data (pre-calculated by automatic test pattern generation (ATPG) software) through the testpoint register to test the downstream logic.
 2. It increases observability for the output ports that do not feed existing scan registers. Without the additional testpoint register, these outputs at the ATE would not be observed, since these outputs are not connected to I/O pads of the chip, but rather drive other internal blocks that are not scan-testable.

Although the present invention has been described in the context of FPGAs, those skilled in the art will understand that the present invention can be implemented in the context of other types of programmable logic devices (PLDs), such as, without limitation, mask-programmable gate arrays (MPGAs), simple programmable logic devices (SPLDs), and complex programmable logic devices (CPLDs). More generally, the present invention can be implemented in the context of any kind of For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method for restricting access to scan testing of a logic device having a programmable fabric, the method comprising the logic device:
    (a) receiving a set of instructions for programming the programmable fabric;
    (b) programming the programmable fabric based on the set of instructions;
    (c) deriving a multi-bit fabric pattern value from the programmed fabric;
    (d) processing the multi-bit fabric pattern value to determine whether or not to restrict access to the scan testing of the logic device; and
    (e) restricting access to the scan testing of the logic device if the processing of the multi-bit fabric pattern value fails to produce a specified fabric pattern result.

2. The invention of claim 1, wherein the logic device is a field programmable gate array.

3. The invention of claim 1, wherein the set of instructions is provided by external test equipment to the logic device via a JTAG interface of the logic device.

4. The invention of claim 1, further comprising the logic device:
    (f) receiving a multi-bit manufacturing key value;
    (g) processing the multi-bit manufacturing key value to determine whether or not to restrict access to the scan testing of the logic device; and
    (h) restricting access to the scan testing of the logic device if the processing of the multi-bit manufacturing key value fails to produce a specified manufacturing key result.

5. The invention of claim 4, wherein the set of instructions and the multi-bit manufacturing key value are provided by external test equipment to the logic device via a JTAG interface of the logic device.

6. The invention of claim 4, further comprising the logic device:
    (i) receiving an instruction;
    (j) processing the instruction;
    (k) restricting access to the scan testing of the logic device if the instruction is not a special scan test instruction; and
    (l) providing access to the scan testing of the logic device if (i) the instruction is the special scan test instruction AND (ii) the processing of the multi-bit fabric pattern value produces the specified fabric pattern result AND (iii) the processing of the multi-bit manufacturing key value produces the specified manufacturing key result.

7. The invention of claim 1, further comprising the logic device:
    (f) receiving an instruction;
    (g) processing the instruction; and
    (h) restricting access to the scan testing of the logic device if the instruction is not a special scan test instruction.

8. The invention of claim 7, wherein the set of instructions and the special scan test instruction are provided by external test equipment to the logic device via a JTAG interface of the logic device.

9. A logic device comprising:
    a programmable fabric; and
    an input/output (I/O) interface, wherein the I/O interface is configured to:
        (a) receive a set of instructions for programming the programmable fabric;
        (b) program the programmable fabric based on the set of instructions;
        (c) receive a multi-bit fabric pattern value from the programmed fabric;
        (d) process the multi-bit fabric pattern value to determine whether or not to restrict access to the scan testing of the logic device; and
        (e) restrict access to the scan testing of the logic device when the processing of the multi-bit fabric pattern value fails to produce a specified fabric pattern result.

10. The invention of claim 9, wherein the logic device is a field programmable gate array.

11. The invention of claim 9, wherein the I/O interface is a JTAG interface.

12. The invention of claim 9, wherein the I/O interface is further configured to:
    (f) receive a multi-bit manufacturing key value;
    (g) process the multi-bit manufacturing key value to determine whether or not to restrict access to the scan testing of the logic device; and (h) restrict access to the scan testing of the logic device if the processing of the multi-bit manufacturing key value fails to produce a specified manufacturing key result.

13. The invention of claim 12, wherein the I/O interface is further configured to:
(i) receive an instruction;
(j) process the instruction;
(k) restrict access to the scan testing of the logic device if the instruction is not a special scan test instruction; and
(l) provide access to the scan testing of the logic device if (i) the instruction is the special scan test instruction AND (ii) the processing of the multi-bit fabric pattern value produces the specified fabric pattern result AND (iii) the processing of the multi-bit manufacturing key value produces the specified manufacturing key result.

14. The invention of claim 9, wherein the I/O interface is further configured to:
(f) receive an instruction;
(g) process the instruction; and
(h) restrict access to the scan testing of the logic device if the instruction is not a special scan test instruction.

15. The invention of claim 9, wherein the I/O interface comprises
a multi-bit state register;
a multi-bit scan register;
a multi-bit multiplexer connected to receive (i) data from the state register at a first mux input and (ii) data from the scan register at a second mux input and selectively output one of the data based on a scan-test mode signal; and
logic connected to receive the data output from the multiplexer, wherein:
when the scan-test mode signal is de-asserted, (i) the multiplexer selects the data from the state register to provide to the logic and (ii) the logic is configured to process the data from the state register to determine whether or not to set a scan-test-mode signal to indicate that the scan-test mode is enabled; and
when the scan-test mode signal is asserted, (i) the multiplexer selects the data from the scan register to provide to the logic and (ii) the logic is configured to process the data from the scan register during scan testing of the logic.

16. The invention of claim 15, wherein the I/O interface further comprises a feedback path from the logic to the scan register to store data in the scan register that (i) is representative of results of the logic processing the data from the scan register and (ii) is shifted out of the scan register to external test equipment.

17. The invention of claim 16, wherein the feedback path comprises a compactor that compresses the processing results of the logic for storage in the scan register.

18. A logic device having an input/output (I/O) interface comprising:
a multi-bit state register;
a multi-bit scan register;
a multi-bit multiplexer connected to receive (i) data from the state register at a first mux input and (i) data from the scan register at a second mux input and selectively output one of the data based on a scan-test mode signal; and
logic connected to receive the data output from the multiplexer, wherein:
when the scan-test mode signal de-asserted, (i) the multiplexer selects the data from the state register to provide to the logic and (ii) the logic is configured to process the data from the state register to determine whether or not to set a scan-test-mode signal to indicate that the scan-test mode is enabled; and
when the scan-test mode signal is asserted, (i) the multiplexer selects the data from the scan register to provide to the logic and (ii) the logic is configured to process the data from the scan register during scan testing of the logic.

19. The invention of claim 18, wherein the I/O interface further comprises a feedback path from the logic to the scan register to store data in the scan register that (i) is representative of results of the logic processing the data from the scan register and (ii) is shifted out of the scan register to external test equipment.

20. The invention of claim 19, wherein the feedback path comprises a compactor that compresses the processing results of the logic for storage in the scan register.

* * * * *